US005600369A

United States Patent [19]

Cazaux et al.

[11] Patent Number: 5,600,369
[45] Date of Patent: *Feb. 4, 1997

[54] LARGE-SIZED PIXEL IMAGE DETECTOR

[75] Inventors: Yvon Cazaux, Grenoble; Jean-Louis Coutures, St. Egreve; Pierre Dautriche, Claix; Gilles Boucharlat, Grenoble, all of France

[73] Assignee: Thomson Composants Militaires Et Spatiaux, Courbevoie, France

[ * ] Notice: The term of this patent shall not extend beyond the expiration date of Pat. No. 5,481,301.

[21] Appl. No.: 432,772

[22] Filed: May 2, 1995

Related U.S. Application Data

[63] Continuation of Ser. No. 71,926, Jun. 4, 1993, Pat. No. 5,481,301, which is a continuation of Ser. No. 756,882, Sep. 9, 1991, abandoned.

[30] Foreign Application Priority Data

Sep. 7, 1990 [FR] France .................. 90 11120

[51] Int. Cl.$^6$ .................................................. H04N 5/335
[52] U.S. Cl. .......................... 348/218; 348/216; 348/316
[58] Field of Search .......................... 348/207, 216, 348/218, 294, 295, 296, 297, 298, 300, 301, 302, 303, 311, 316; H04N 5/335

[56] References Cited

U.S. PATENT DOCUMENTS 4,280,141  7/1981  McCann et al. .................. 348/295
4,638,354  1/1987  Denimal .......................... 348/133
4,775,798  10/1988 Monier ........................... 250/578
4,805,000  2/1989  Ogawa et al. .................... 357/30
5,113,263  5/1992  Audaire et al. .................. 348/303
5,481,301  1/1996  Cazaux et al. ................... 348/218

FOREIGN PATENT DOCUMENTS 168267     1/1986   European Pat. Off. ....... H04N 5/335
207826     1/1987   European Pat. Off. ....... H04N 5/335
59-210775  11/1984  Japan ........................... H04N 5/30
60-146165  8/1985   Japan ........................... G01S 3/78
61-79379   4/1986   Japan ........................... H04N 5/335

Primary Examiner—John K. Peng
Assistant Examiner—Tuan V. Ho
Attorney, Agent, or Firm—Oblon, Spivak, McClelland, Maier & Neustadt, P.C.

[57] ABSTRACT

A method of detecting electromagnetic radiation imparted onto a matrix of photosensitive photomos networks in which pixels of each photomos network are simultaneously exposed to electromagnetic radiation source for a predetermined period of time. Thereafter, transfer signals are applied to each photomos pixel and accumulated charges corresponding to the strength of the radiation imparted onto the pixels are transferred in a columnwise fashion to the end of each column of the photomos networks. The charges are summed at the end of the columns and placed in a reading register. The charges in the reading register of each photomos network are summed and a signal is output corresponding to the strength of the electromagnetic radiation imparted onto the photomos network.

3 Claims, 4 Drawing Sheets

LARGE-SIZED PIXEL IMAGE DETECTOR

This is a Continuation of application Ser. No 08/071,926 filed on Jun. 4, 1993, now U.S. Pat. No. 5,481,301, which is a File-Wrapper-Continuation of application Ser. No. 07/756,882, filed Sep. 9, 1991, now abandoned.

BACKGROUND OF THE INVENTION

1. Field of the Invention

The invention applies to image sensor devices formed by photosensitive semiconductors and more particularly to such devices comprising at least one "large-sized" photosensitive surface.

2. Description of the Related Art

The image sensor devices with semiconductors most often comprise either multiple photosensitive elements placed in lines and in columns, or a single line of these photosensitive elements which then constitute a strip. Each photosensitive element corresponds to an elementary image point, and the dimensions of this elementary image point are linked to those of the photosensitive surface of the sensor element. In the description below, the photosensitive surface of a sensor element is called "pixel." It should be noted that in some cases, the image sensor device can comprise a single photosensitive element, i.e., a single pixel.

The pixels have dimensions which vary with the application. For example, when an effort is made to obtain a high image resolution, pixels of small dimensions (for example, 10 microns×10 microns) are used. In other cases, pixels called "large sized" (for example, on the order of 100 microns×100 microns) are used, in particular in an application in communications between satellites.

The semiconductive photosensitive elements are now photodiodes or else elements produced according to MOS (from "Mental Oxide Semiconductor") technology. In MOS technology, a capacitance is produced by depositing, on a semiconductive substrate, an insulating layer formed by an oxide, and covered by a conductive layer. This conductive layer constitutes an electrode and it is often made of a polycrystalline silicon layer. According to this MOS technology, a sequence of such capacitances able to form a sequence of stages of a shift register of the type with charge transfer or, in abbreviated form, "CCD" ("Charges Coupled Device") is now produced on the same semiconductive substrate. In these charge transfer registers, each stage can collect charges produced by the light and store these charges. These charges are then transferred from one stage to another to a reading register itself of the CCD type. Thus, each MOS type capacitance can constitute a photosensitive element which is known under the name of photomos, the name under which it is called in the description.

In the image sensors or imagers having large-sized pixels, these pixels consist of photodiodes. These image sensors are generally formed by N lines comprising M photosensitive points each (with N equal to or greater than 1 and M equal to or greater than 1). A surface imager of this type can be obtained by juxtaposing several lines or strips of photodiodes. A CCD type shift register, constituting a reading register of which each stage corresponds to a photodiode or pixel, is associated with each line.

For reading, the charges of each pixel are transferred in the corresponding stage of the reading register (simultaneously for all the lines), then the register is dumped to an output circuit making it possible in particular to convert the charges into voltage; there are therefore, in this case, as many outputs as there are lines.

According to another known structure, the imager is in a matrix form. In this case, on the one hand, each photodiode is connected to a conductor in a column by a switching element often consisting of a MOS type transistor; on the other hand, each column is connected to a stage of a CCD type shift register. The reading is made according to a line by line addressing: in the "conducting" state, all of the switching elements of the same line are controlled so that in each column conductor, the charges accumulated by a photodiode belonging to the addressed line flow. These charges are stored in the corresponding stage of the register, then the latter having been dumped, the addressing of the following line is performed.

In the application to large-sized pixels, the photomos are removed because they present in particular as a drawback the requirement of a relatively long period to dump in a correct way the accumulated or stored charges (the step of the photomos should be compatible with the transfer of the charges).

With the photodiodes, this defect is much less pronounced, but the photodiodes have other serious drawbacks linked to the strong capacitance that they exhibit. This strong capacitance of the photodiodes in particular causes a very significant reading noise as well as a very detrimental hangover or remanence.

SUMMARY OF THE INVENTION

This invention proposes a new architecture for an image sensor, making it possible to produce at least one large-sized pixel, without encountering the drawbacks cited above. This is obtained in particular by using multiple sensors or photosensitive elements of photomos type, i.e., of CCD type, each having at a maximum a dimension compatible with a correct transfer of charges in the time assigned, to form a photosensitive surface corresponding to a large-sized pixel, and by making the summation of the elementary data contained in each of these photomos.

According to the invention, an image sensor device comprising a network of photosensitive surfaces placed along N lines and M columns (with N equal to or greater than 1 and M equal to or greater than 1), each photosensitive surface producing charges as a function of its illumination, is characterized in that each photosensitive surface comprises a network of photomos placed along j intermediate lines and i intermediate columns (with j equal to or greater than 2 and i equal to or greater than 1), each line of photosensitive surfaces comprising a reading register having at least as many reading stages as there are intermediate columns, each photomos sequence along the direction of the intermediate columns constituting a shift register ending in a reading stage, each reading stage having the capacity to store all the charges accumulated in the corresponding intermediate column.

BRIEF DESCRIPTION OF THE DRAWINGS

The invention will be understood better and other advantages that it obtains will come out in the reading of the following description, given by way of nonlimiting example with reference to the accompanying figures, of which.

DETAILED DESCRIPTION OF THE INVENTION

Figure 1:
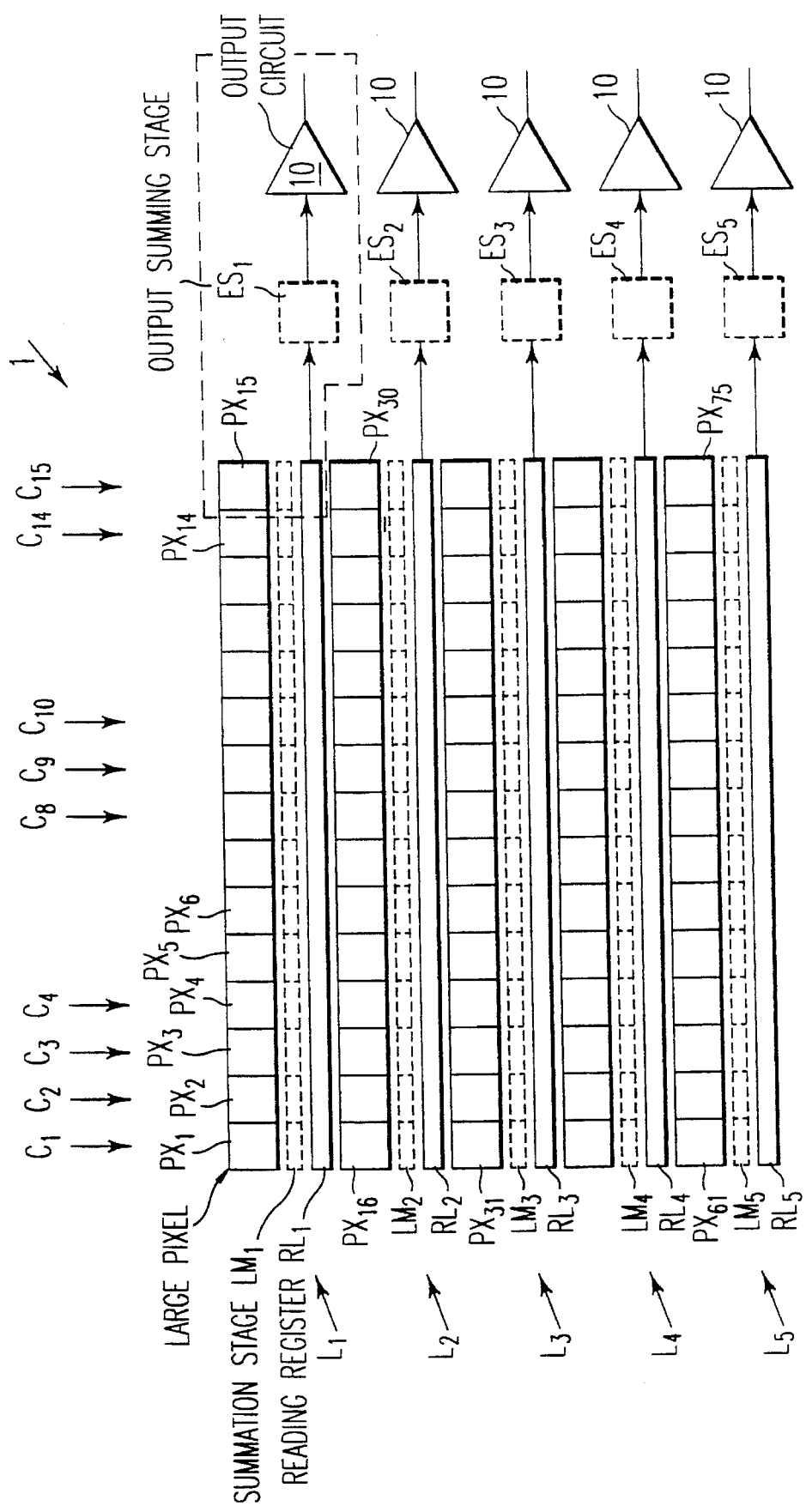
FIG. 1 is a diagram of a first embodiment of an image sensor according to the invention.

FIG. 1 diagrammatically represents an image sensor 1 according to the invention. Image sensor 1 comprises an image zone formed by a network of N times M main photosensitive surfaces, each constituting a large-sized pixel PX1 to PX75 called large pixel in the description below (a pixel is considered large-sized when these dimensions become incompatible with a correct operation in a conventional image sensor). The large pixels are placed along N rows and M columns. In the nonlimiting example shown in FIG. 1, N=5 and M=15, and consequently, five rows L1 to L5 of large pixels PX1 to PX75 and fifteen columns C1 to C15 are represented; but in the spirit of the invention, the number N of rows being equal to or greater than 1, image sensor 1 can comprise a larger number of large pixels or a single large pixel PX1.

Each row L1 to L5 comprises a reading register RL1 to RL5 intended to dump to an output circuit 10 the charges produced at the level of large pixels PX1 to PX75 when they are exposed to a radiation, of light, for example.

Figure 2:
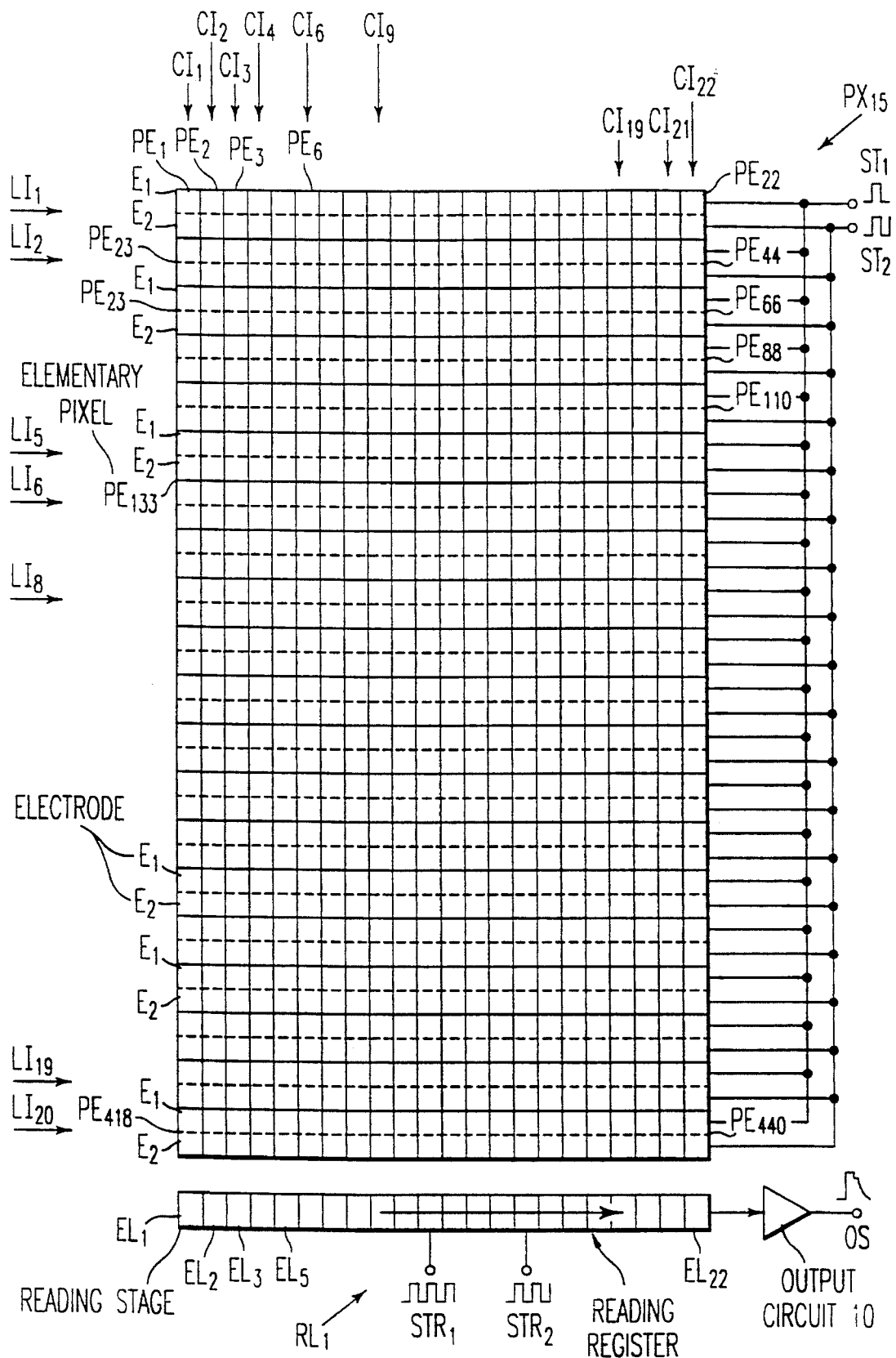
FIG. 2 diagrammatically shows, in more detail, the photosensitive surface shown in FIG. 1.

According to a characteristic of the invention, each photosensitive surface or large pixel PX1 to PX75 consists of a matrix network of elementary pixels as shown in FIG. 2.

FIG. 2 is an enlarged view of a large PX15 shown in FIG. 1 and enclosed in a box formed by dashed lines, for example. FIG. 2 illustrates a large pixel PX15; with a network of j times i elementary pixels, each formed by a photomos. The photomos or elementary pixels are placed along j intermediate rows and i intermediate columns. The term "intermediate" attributed to these intermediate rows and columns makes it possible to better differentiate rows and columns formed by the large pixels and which are called "main lines L1 to L5 and main columns C1 to C15 in the description below. The number j is equal to or greater than 2 and number i is equal to or greater than 1. Actually, number j defines the number of elementary pixels in an intermediate column, and at a minimum, this number should be such that the transfer of the charges is correctly accomplished as a function of the time assigned. However, with a single elementary pixel per intermediate column, the invention loses its advantage and the minimum value for the number j is therefore 2.

In the nonlimiting example described, j=20 and i=22, as a result, 20 intermediate rows LI1 to LI20 and 22 intermediate columns CI1 to CI22 are represented, which form 440 elementary pixels PE1 to PE440. For the sake of convenience of representation, the dimension of elementary pixels PE1 to PE440 is shown larger in the direction of the intermediate columns than in the direction of the intermediate lines, but, of course, these elementary pixels can have a different geometry.

Elementary pixels PE1 to PE440 consist of photomos standard in the art, so that in the direction of intermediate columns CI1 to CI22, they can constitute in a conventional manner a transfer stage sequence. They thus can form a transfer register, transferring the charges in the direction of first intermediate row LI1 to a reading register RL1 located at the other end of the intermediate columns after twentieth intermediate line LI20.

This transfer can be performed equally in biphase, three- or four-phase mode. In the nonlimiting example described, it is performed in biphase with two transfer signals ST1, ST2 having different phases. For this purpose, each elementary pixel PE1 to PE440 comprises, in a way standard in the art, two electrode pairs E1, E2 which follow one another in the direction of intermediate columns CI1 to CI22 and to which are applied transfer signals ST1, ST2.

The reading register is a CCD shift register. It comprises at least as many reading stages EL1 to EL22 as there are intermediate columns CI1 to CI22. Actually, reading register RL1 can be common to several large pixels, located on a same main row L1 to L5. Also, the number of reading stages should at least be equal to the total number of intermediate columns that a main line L1 to L5 comprises, so that in any case, a reading stage corresponds to each intermediate column.

According to another characteristic of the invention, each reading stage EL1 to EL22 is designed (in its dimensions, for example) to be able to store the sum of the amounts of accumulated charges in various elementary pixels PE1 to PE440 which form intermediate column CI1 to CI22 to which the reading stage corresponds.

Under these conditions, the operation of image sensor device 1 is as follows:

after a phase of exposure to the light in which all or part of the photosensitive surface, i.e., of large pixel PX15, is exposed, transfer signals ST1, ST2 are applied to all electrodes E1, E2 of all elementary pixels PE1 to PE440. The latter then operate as registers and, in the direction of the intermediate columns, transfer the charges optionally accumulated by each of them, to charge them in corresponding reading stage EL1 to EL22; reading register RL1 being stopped, of course. Each cycle of transfer signals ST1, ST2 shifts by one position (i.e., by one elementary pixel) to the reading register, the accumulated charges in each of the elementary pixels. In the example illustrated in FIG. 2 where each intermediate column comprises 20 elementary pixels, 20 cycles of transfer signals are necessary for the charges produced in elementary pixels PE1 to PE22 of first intermediate line LI1 to be transferred in the corresponding reading stage. These 20 cycles of transfer signals ST1, ST2 represent charging period TC of reading register RL; and at the end of this charging period, each stage of the reading register contains the sum of the charges produced in entire corresponding intermediate column CI1 to CI22.

At the end of this charging period TC, the reading register can dump all the data that it contains (in the form of charges) to an output circuit (to which it is connected). The output stage can comprise, for example, in the conventional way, an amplifier 10 delivering a voltage output signal O.S. as a function of each amount of charges delivered by reading register RL.

Reading register RL1 is of a standard type operating, for example, in biphase under the action of two register transfer signals STR1, STR2 having opposite phases. At the end of charging period TC, the two transfer control signals are applied to reading register RL1, and the charges contained in each reading stage EL1 to EL22 are successively applied to output circuit 10, while the image zone integrates the next image.

With reference again to FIG. 1, it is possible to see in the latter that for each main rows L1 to L5, reading register RL1 to RL5 is common for all large pixels PX1 to PX75 belonging to the same line. Each pixel PX1 to PX75 being constituted like large pixel PX15 shown in FIG. 2, the number of reading stages can be very large.

On the other hand, transfer signals ST1, ST2 applied to electrode pairs E1, E2 (shown in FIG. 2) are applied simultaneously to all these electrodes E1, E2 of all large pixels PX1 to PX75 of a same main row L1 to L4 with the help of common control means (not represented).

Consequently, when the total dimension of the image sensor is large, a limitation of the operation appears, linked to the distributed time constants of the lines of polycrystalline silicon which form the photomos electrodes in a standard way.

This limitation in the use of the image sensor can be very serious if the data flow expected at the output of output circuit 10 is high. Actually, a duration TL is used as a line period, during which, on the one hand, the charging operation in reading register RL1 to RL5 during period TC, then next the reading by output stage 10 of all the data contained in reading register RL1 to RL5 during period TC should be performed successively: if charging period TC is increased because of the distributed constants, reading period t1 of M large pixels each consisting of i intermediate columns is reduced proportionately.

This can lead to increasing the control frequency of reading registers RL1 to RL5 to values where the operation can be very difficult to guarantee.

To minimize the control frequency of reading register RL1 to RL5, and according to a new characteristic of the invention, a summation stage can be interposed between reading register RL1 to RL5 and each of the intermediate columns of all the large pixels which constitute a main line L1 to L5. This version of the invention with summation stages is symbolized in FIG. 1 with a line LM1 to LM5 symbolized by dotted lines, and it is explained in more detail with reference to FIG. 3. It should further be noted that an output summing stage ES1 to ES5, interposed between each reading register RL1 to RL5 and each output circuit 10, and whose operation is also explained with reference to FIG. 3, has been represented in FIG. 1, also in dotted lines.

Figure 3:
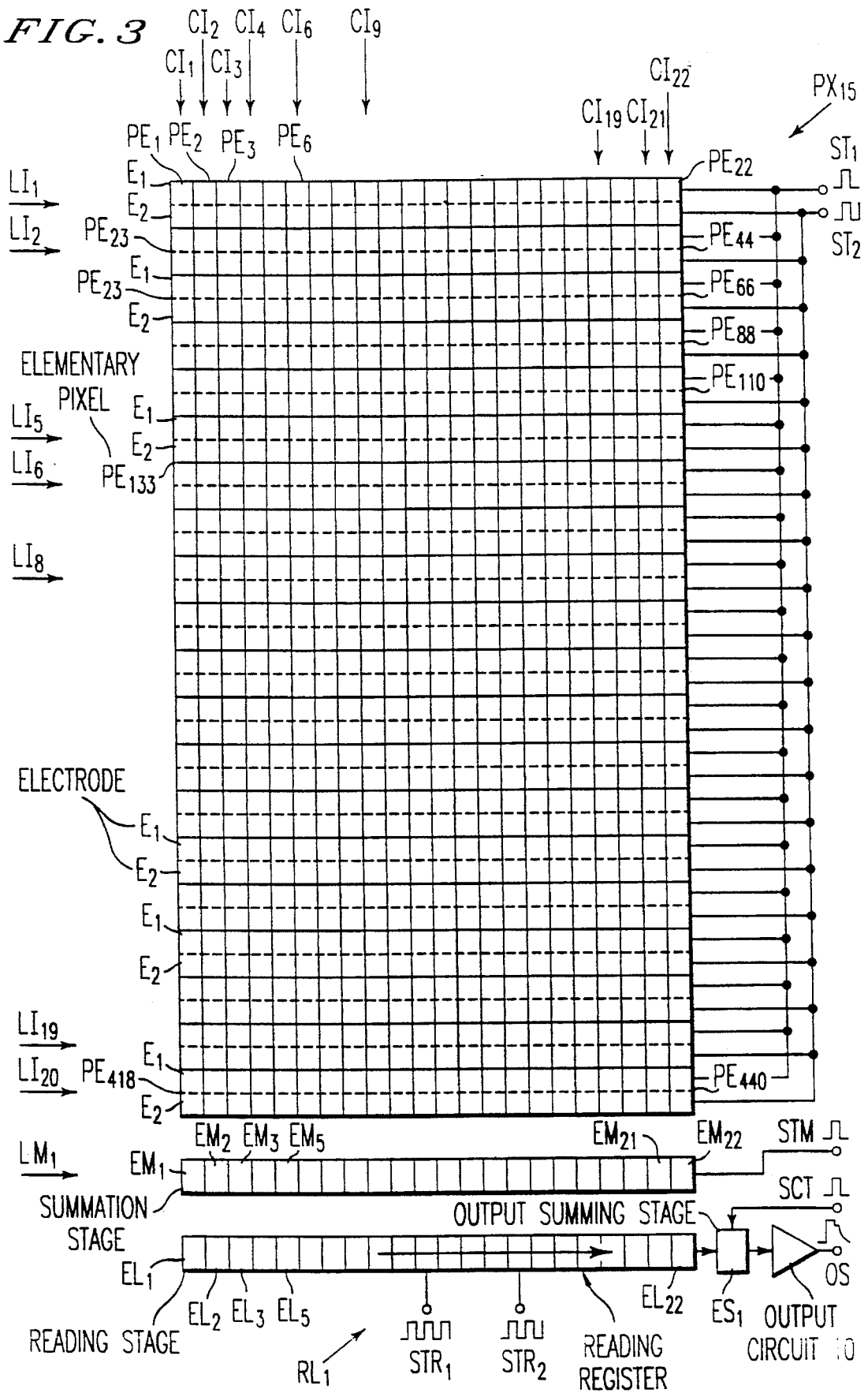
FIG. 3 diagrammatically shows the photosensitive surface of FIG. 2 operating with summation stages.

FIG. 3 shows fifteenth pixel PX15 by a view similar to that of FIG. 2, with the difference that, on the one hand, a summation stage EM1 to EM22 is interposed between each intermediate column CI1 to CI22 and each reading stage EL1 to EL22; and that, on the other hand, an output summing stage ES1 is placed in series between reading register RL1 and output circuit 10.

Each summation stage EM1 to EM22 is standard in the art, produced, for example, according to the MOS technology, and it can, moreover, be constituted as an elementary pixel PE1 to PE440.

The function of each of these summation stages is to receive almost continuously and to store the charges produced by all the elementary pixels of the intermediate column to which they each correspond.

Under these conditions, it is sufficient to apply transfer signals ST1, ST2 continuously to electrode pairs E1, E2 so that in each intermediate column CI1 to CI22, the charges created in the intermediate column are continuously transferred in corresponding summation stage EM1 to EM22, while in the example described with reference to FIG. 2, the transfer in the intermediate columns is limited to charging period TC. At the end of line period TL, i.e., at the end of the integration period or period of exposure to the light, the charges accumulated in each summation stage EM1 to EM22 are transferred almost instantaneously in corresponding reading stage EL1 to EL22. Actually, it is sufficient for this purpose for a transfer step, which is made under the control of a memory transfer signal STM applied simultaneously to all summation stages EM1 to EM22.

Transfer control signals STR1, STR2 are then applied to reading register RL1, to dump to output circuit 10 the data or charges contained in each of reading stages EL1 to EL22.

This method leads to reducing, to the point of virtually eliminating, charging period TC, and thus makes it possible to give virtually the entire duration of line period TL to the transfers in reading registers RL1 to RL5, i.e., to the reading of data or charges by output circuit 10.

Thus, the frequency of the control signals applied to reading registers RL1 to RL5, and the frequency of transfer signals ST1, ST2 applied to electrode pairs E1, E2, i.e., to the image zone, are minimized at the same time. Actually, the transfer in the intermediate columns being continuous, its duration for an entire intermediate column, i.e., the duration of the transfer of j intermediate lines, can be brought to the maximum which is the duration of a line period TL.

According to another characteristic of the invention, an output summing stage ES1 to ES5 is interposed between reading register RL1 and output stage 10. This summing stage makes it possible to sum the amounts of charges contained in a given sequence of reading stage of reading registers RL1 to RL5 and corresponding to i intermediate columns (i=22 in the example) of a large pixel; the charges can be delivered by summing stage ES1 in the form of bundles, each comprising the sum of the charges delivered by all the intermediate columns of a large pixel. As a result, during the period of line period TL, the flow of output from output circuit 10 corresponds to the reading of M large pixels, and no longer of M times i intermediate columns. As a result, the passband necessary for the amplifier of output circuit 10 can be reduced, which leads to a significant reduction of the "RMS" ("Root Mean Square") output reading noise of the image sensor. Summing stage ES1 of output 20 can be constituted, for example, as a summation stage EM1 to EM22. It is sufficient to control the transfer of the charges that it contains, to output circuit 10, with a transfer control signal SCT which is applied to it with a phase relation determined relative to the transfer of the reading register; a transfer control signal SCT being applied to summing stage ES1 because of i transfers in reading register RL1. Of course, summing stage ES1 should have the capacity to store all the charges produced by a large pixel PX1 to PX75, i.e., the sum of the charges produced by j times i elementary pixels.

Output summing stage ES1 can be interposed between the reading register and output stage 10, both in the version with summation stages EM1 to EM22 and in that described with reference to FIG. 2.

Figure 4:
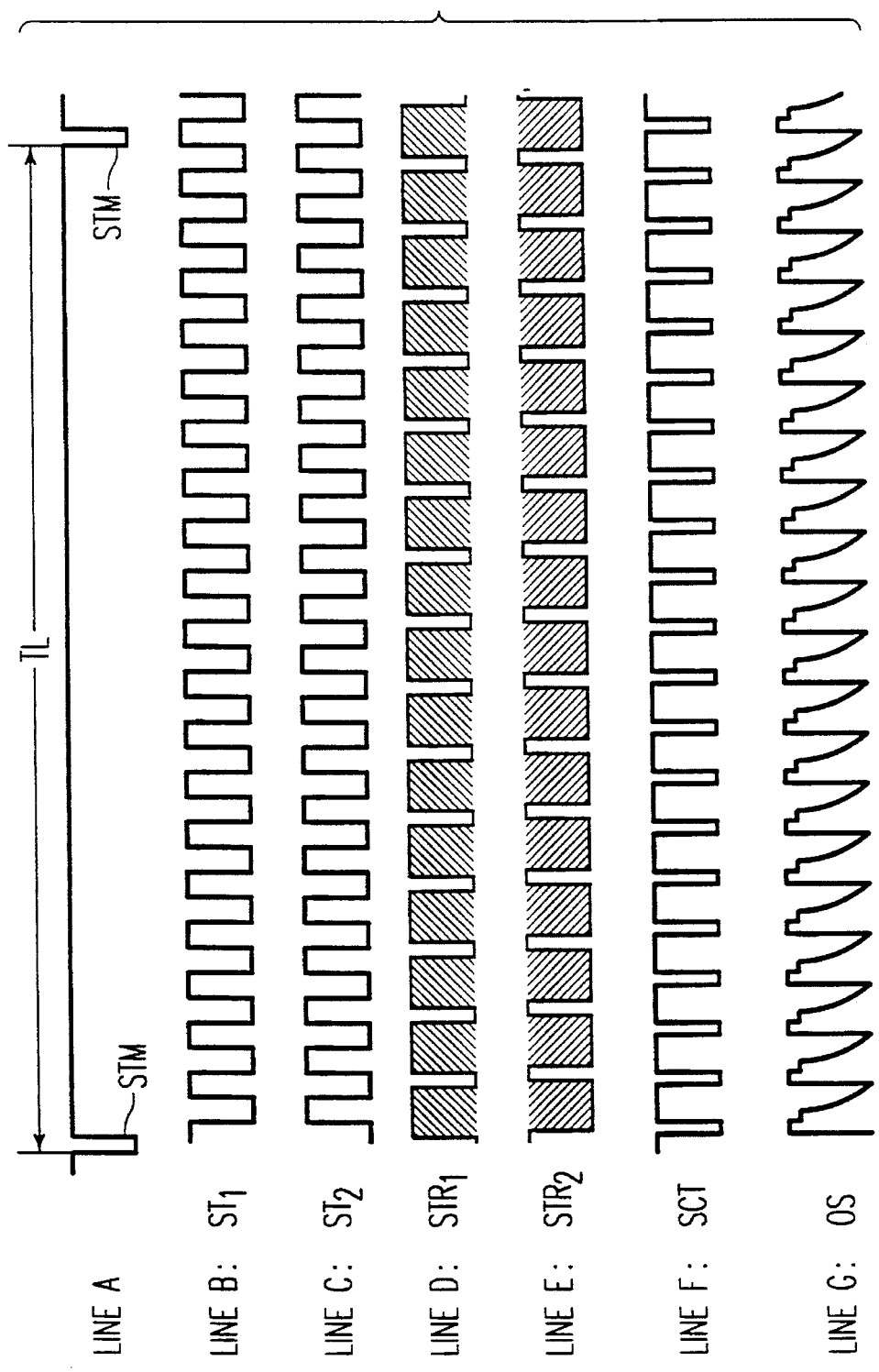
FIG. 4 is a timing diagram illustrating the operation of the photosensitive surface of FIG. 3.

FIG. 4 is a timing diagram which illustrates, by lines A to G, by way of nonlimiting example, the operation of the image sensor in the version with summation stages EM1 to EM22 and output summing stage ES1 to ES5.

Line A represents the duration of a line period TL, period which is defined between two successive transfer signals STM applied to summation stages EM1 to EM22.

Lines B and C respectively represent a sequence of first and second transfer signals ST1, ST2 applied to electrode pairs E1, E2 of each elementary pixel PE1 to PE440, with opposite phases. Taking into account the described example in which each intermediate column comprises 20 elementary pixels, 20 transfer signals ST1, ST2 follow one another in the period of a line period TL.

Lines D and E represent two register transfer signals STR1, STR2 applied to reading registers RL1 to RL5. By assuming that main lines L1 to L5 of large pixels PX1 to PX75 contain 15 large pixels each and that each large pixel contains 22 intermediate columns, it is necessary that during the period of line period TL, each reading register RL1 to RL5 produces 15 times 22 transfers to output summing stage ES1 to ES5; the latter under the control of register transfer signals STR1, STR2. To perform this operation, signals STR1, STR2 have been grouped in bundles of 22 signals each.

Line F represents a sequence of transfer control signals SCT applied to output summing stage ES1 to ES5, during the period of line period TL, at a rate of one control signal SCT for 22 register transfer signals STR1, or STR2, i.e., for each bundle of these signals as they are represented in lines D and E. Each of these signals has the effect of applying to output circuit 10 an amount of charge which is the total amount produced by a large pixel.

Line G illustrates the sequence of output signals O.S. delivered by output circuit 10, at the same frequency as transfer control signals SCT applied to output summing stage ES1 to ES5.

What is claimed is:

1. A method for detecting electromagnetic radiation imparted onto a network of photosensitive surfaces, each photosensitive surface comprising a photomos network of at least one column of at least two lines of elementary pixels, said at least one column forming a vertical shift register having P photosensitive pixels, including one end pixel, and said sensor comprising a horizontal reading register having one reading stage at one end of each column, said method comprising the steps of:

simultaneously exposing all of the photomos networks of at least one photosensitive surface to electromagnetic radiation during a predetermined period of time, thereby charging elementary pixels of each photomos network;

applying, after the predetermined period of time has ended, transfer signals to each vertical shift register so as to shift in P steps, the charges of all the elementary pixels of the corresponding column towards said one end of the column and shift correspondingly P times, the charges of the end pixel of the column into the reading stage of the corresponding column;

summing in the reading stage of the corresponding column the charges received from the end pixel of the column during the P shift steps, said charges resulting from exposure of all the pixels of the column to electromagnetic radiation during the said predetermined period of time; and applying transfer signals to said horizontal reading register so as to transfer towards an output of the horizontal reading register the charges contained in the reading stages.

2. A method for detecting electromagnetic radiation imparted onto a network of photosensitive surfaces, each photosensitive surface comprising a photomos network of at least one column of at least two lines of elementary pixels, said at least one column forming a vertical shift register having one end pixel, and said sensor comprising a horizontal reading register having one reading stage at one end of each column, said method comprising the steps of:

simultaneously exposing all of the photomos networks of at least one photosensitive surface to electromagnetic radiation for successive predetermined periods of time, thereby charging elementary pixels of each photomos network;

applying, after each predetermined period of time, transfer signals to the shift register of each column so as to shift one step towards said one end of the column the charges accumulated in the elementary pixels of the column and to transfer from the end pixel of the column into a summation stage, connected between said one end of the column and the corresponding reading stage, the charges contained in said end pixel;

summing in said summation stage the charges transferred from said end pixel during K successive predetermined periods of time;

periodically transferring, after K successive periods of time, the charges thus accumulated in said summation stage, into the corresponding reading stage of the reading register; and applying transfer signals to the reading register so as to shift towards an output of the reading register the charges contained in the reading stages.

3. An image sensor comprising:

a network of photosensitive surfaces, each photosensitive surface comprising a photomos network of at least one column of at least two lines of elementary photosensitive pixels, said at least one column forming a photosensitive vertical shift register having one end pixel, and said photomos networks being simultaneously exposed to electromagnetic radiation for successive predetermined periods of time;

a horizontal reading register for receiving charges from the network and transferring the charges towards an output of the sensor, said register comprising a respective reading stage for each column;

a respective summation stage connected to one end of each column, between said end pixel of the column and a corresponding reading stage of the horizontal register, for summing the charges received from said end pixel during K successive periods of time;

means for applying, after each predetermined period of time, transfer signals to the vertical shift register of said at least one column so as to shift one step towards said one end of the corresponding column the charges accumulated in the elementary pixels of the column during said predetermined period of time, and so as to transfer to the corresponding summation stage the charges contained in said end pixel of the column;

means for periodically transferring in the reading stage, after a group of K successive periods of time, the charges accumulated in the summation stage during, said K successive periods of time; and means for transferring towards an output of the reading register the charges transferred in the reading stages at the end of the group of K successive periods.

\* \* \* \* \*